(12) United States Patent
Matsuura

(10) Patent No.: US 7,192,164 B2
(45) Date of Patent: Mar. 20, 2007

(54) LIGHT-EMITTING APPARATUS AND ILLUMINATING APPARATUS

(75) Inventor: Shingo Matsuura, Shiga (JP)

(73) Assignee: Kyocera Corporation, Kyoto (JP)

( * ) Notice: Subject to any disclaimer, the term of this patent is extended or adjusted under 35 U.S.C. 154(b) by 154 days.

(21) Appl. No.: 11/066,624

(22) Filed: Feb. 25, 2005

(65) Prior Publication Data
US 2005/0236628 A1   Oct. 27, 2005

(30) Foreign Application Priority Data
Feb. 26, 2004   (JP) .......................... P2004-052546

(51) Int. Cl.
*F21V 7/00* (2006.01)
(52) U.S. Cl. .................................. 362/296; 362/260
(58) Field of Classification Search ................ 362/223, 362/260, 296, 307, 311
See application file for complete search history.

(56) References Cited

U.S. PATENT DOCUMENTS

| | | | | |
|---|---|---|---|---|
| 3,821,775 A | * | 6/1974 | Biard ........................... | 257/98 |
| 6,710,544 B2 | * | 3/2004 | Schliep et al. .............. | 313/512 |
| 7,112,916 B2 | * | 9/2006 | Goh et al. .................. | 313/113 |
| 2002/0105268 A1 | | 8/2002 | Schliep et al. | |
| 2005/0073849 A1 | * | 4/2005 | Rhoads et al. .............. | 362/296 |

FOREIGN PATENT DOCUMENTS

| | | |
|---|---|---|
| DE | 19638667 | 4/1998 |
| DE | 10105802 | 8/2002 |
| JP | 2000-349346 | 12/2000 |

* cited by examiner

Primary Examiner—Thomas M. Sember
Assistant Examiner—Adam C. Rehm
(74) Attorney, Agent, or Firm—Hogan & Hartson LLP (57) ABSTRACT

A light-emitting apparatus includes a light-emitting element, a base body, a reflection member and a fluorescent material layer. A cross section of the inner surface of the reflection member cut by a virtual plane including a virtual axis penetrating a center of the inner surface and perpendicular to the upper principal surface of the base body has a sectional profile defined by a curved line expressed by the following formula, and the inner surface of the reflection member is a curved surface obtained by rotating the curved line about the virtual axis: $Z = (cr^2)/[1+\{1-(1+k)c^2r^2\}^{1/2}]$ (where $-10 \leq k \leq -0.001$, $0.001 \leq c \leq 10$). An angle $\theta_1$ which is made by an upper surface of the fluorescent material layer and a line which connects one corner of a light-emitting portion of the light emitting element with an uppermost position of the inner surface and is tangent to the one corner, is given as $\theta_1 \geq 90° - \sin^{-1}(1/n_1)$.

12 Claims, 3 Drawing Sheets

LIGHT-EMITTING APPARATUS AND ILLUMINATING APPARATUS

BACKGROUND OF THE INVENTION

1. Field of the Invention

The present invention relates to a light-emitting apparatus housing a light-emitting element, and an illuminating apparatus employing the light-emitting apparatus.

2. Description of the Related Art

Figure 4:
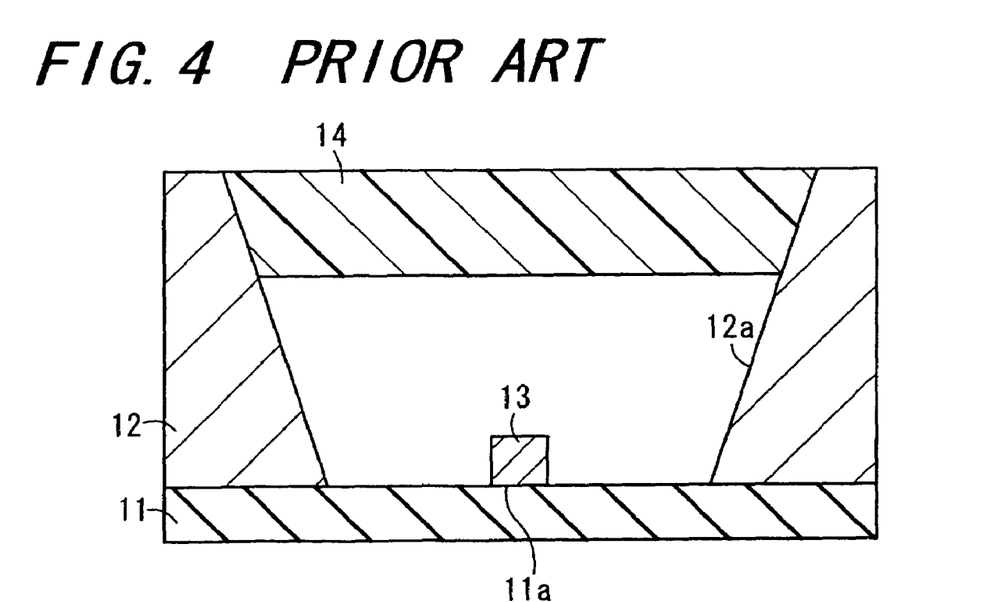
FIG. 4 is a sectional view showing a conventional light-emitting apparatus.
Figure 5A:
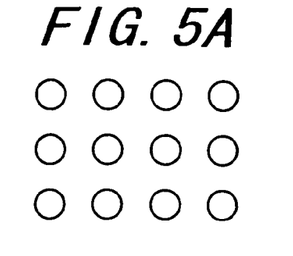
FIGS. 5A to 5E is plan views showing arrangement examples of the light-emitting apparatuses used in an illuminating apparatus.
Figure 5B:
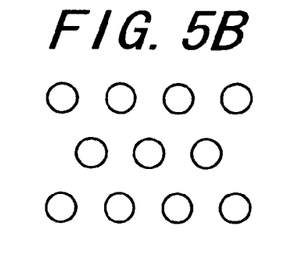
Figure 5C:
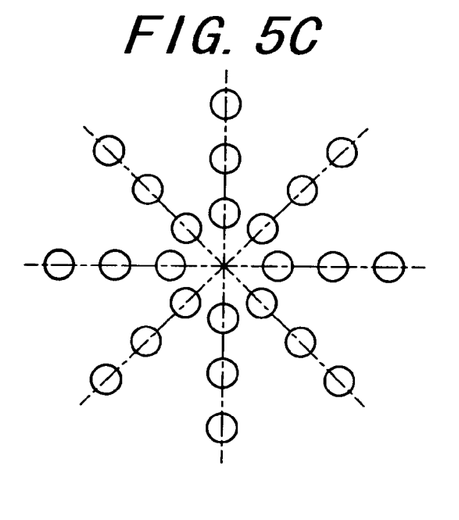
Figure 5D:
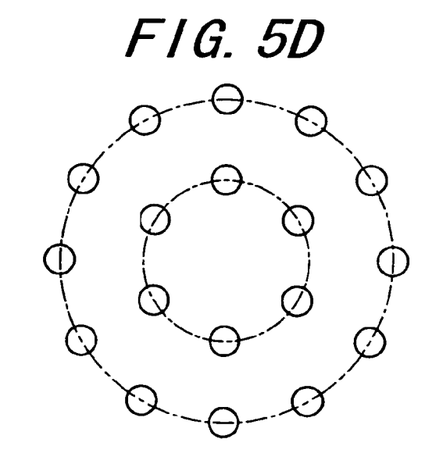
Figure 5E:
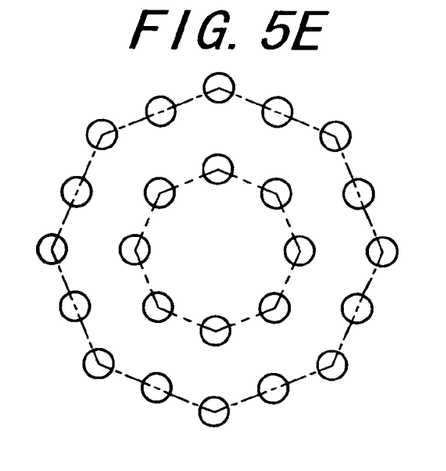

FIG. 4 is a sectional view showing a light-emitting apparatus of conventional design. In FIG. 4, the light-emitting apparatus is mainly composed of a base body 11, a reflection member 12, a light-emitting element 13 and a fluorescent material layer 14. The base body 11 is made of an insulator and has, at the center of its top surface, a placement portion 11a for emplacing thereon the light-emitting element 13. The base body 11 is also provided with a wiring conductor (not shown) formed of, for example, a metallized wiring line and a lead terminal for electrically conductively connecting within and without the light-emitting apparatus through the placement portion 11a and its environs. The reflection member 12 has a frame-like form and is fixedly bonded to the top surface of the base body 11. An inner surface 12a of the reflection member 12 is inclined so as to extend outward gradually in an upward direction and is shaped into a reflection surface for reflecting light emitted from the light-emitting element 13. The fluorescent material layer 14 is composed of a light transmitting member that contains a fluorescent material (not shown) for performing wavelength conversion on the light emitted from the light-emitting element 13.

The base body 11 is made of a ceramic material such as sintered aluminum oxide (alumina ceramics), sintered aluminum nitride, sintered mullite, or glass ceramics, or a resin material such as epoxy resin. In a case where the base body 11 is made of a ceramic material, on the top surface thereof is formed a wiring conductor by firing a metal paste of tungsten (W) or molybdenum (Mo)-manganese (Mn) at a high temperature. On the other hand, in a case where the base body 11 is made of a resin material, a molded lead terminal made of copper (Cu) or an iron (Fe)-nickel (Ni) alloy is fixedly arranged within the base body 11.

The reflection member 12 is formed of a metal material such as aluminum (Al) or an Fe—Ni-cobalt (Co) alloy, or a ceramic material such as alumina ceramics, or a resin material such as epoxy resin, through a a cutting process, or a molding technique such as die-molding or extrusion.

Moreover, the reflection member 12 has its inner surface 12a shaped into a reflection surface for reflecting light emitted from the light-emitting element 13 or the fluorescent material layer 14. The inner surface 12a is finished off by coating thereon a metal such as Al by means of vapor deposition or plating. The reflection member 12 is finally joined to the top surface of the base body 11, with use of a bonding material such as solder, a brazing filler material such as silver (Ag) brazing filler, or a resin adhesive, in such a way that the placement portion 11a is surrounded by the inner surface 12a.

The light-emitting element 13 is constituted by forming a light-emitting layer on a monocrystalline substrate such as a sapphire substrate by means of the liquid-phase growth method or MOCVD method. The examples of materials used for the light-emitting layer include: a gallium (Ga)—Al-nitride (N) compound; a zinc (Zn)-sulfur (S) compound; a Zn-selenium (Se) compound; a silicon (Si)-carbon (C) compound; a Ga-phosphorus (P) compound; a Ga—Al-arsenic (As) compound; an Al-indium (In)—Ga—P compound; an In—Ga—N compound; a Ga—N compound; and an Al—In—Ga—N compound. The light-emitting element 13 may have a homo structure, a hetero structure, or a double-hetero structure including an MIS junction or PN junction. The luminescence wavelength of the light-emitting element 13 shall be selected according to the material used for the light-emitting layer and its mix crystal ratio, for example, in a range from ultraviolet to infrared regions. The light-emitting element 13 is, at its electrode, electrically connected to the wiring conductor arranged near the placement portion 11a by using a bonding wire (not shown) or by adopting a flip-chip bonding method. In regard to the flip-chip bonding method, the light-emitting element 13 is arranged with the electrode side down, and connection is established through a solder bump.

The fluorescent material layer 14 is formed in the shape of a plate by subjecting a light transmitting member such as epoxy resin or silicone resin charged with a fluorescent material to a heat-hardening process. By arranging the fluorescent material layer 14 so as to cover the opening of the reflection member 12, visible or ultraviolet light with the luminescence wavelength emitted from the light-emitting element 13 can be absorbed and converted into light with longer wavelength. Thus, various materials may be used for the fluorescent material layer 14 in consideration of the luminescence wavelength of the light emitted from the light-emitting element 13, as well as desired light emitted from the light-emitting apparatus, whereby making is possible to realize a light-emitting apparatus with which light having a desired wavelength spectrum can be taken out. Moreover, the light-emitting apparatus is allowed to emit white light under conditions where the light emitted from the light-emitting element 13 and the light emitted from the fluorescent material are in a complementary-color relation to each other.

The preferred examples of the fluorescent material in use include: a cerium (Ce)-activated yttrium aluminum garnet-based fluorescent material; a perylene derivative; copper (Cu)—Al-activated zinc cadmium sulfide; manganese (Mn)-activated magnesium oxide; and titanium oxide. The fluorescent material may be formed of either a single substance or a mixture of two or more different substances.

Related art is disclosed in Japanese Unexamined Patent Publication JP-A 2000-349346.

However, the above-described conventional light-emitting apparatus has a simple structure in which the inner surface 12a is inclined rectilinearly so as to extend outward gradually in an upward direction. Inconveniently, in this structure, part of the light emitted from the light-emitting element 13 is reflected from the inner surface 12a over and over again until it is shone onto the fluorescent material layer 14. As a result, the intensity of the light emitted from the light-emitting element 13 is reduced due to light absorption caused by the reflection member 12. This gives rise to a problem of the radiation light intensity and brightness in the light-emitting apparatus being significantly deteriorated.

Furthermore, part of the light emitted from the light-emitting element 13 and reflected from the inner surface 12a enters the fluorescent material layer 14 at an incident angle larger than the critical reflection angle. This causes total reflection of light in a lower surface of the fluorescent material layer 14, and thus wavelength conversion is no longer effected by the fluorescent material. As a result, there arises a problem of the radiation light intensity and brightness in the light-emitting apparatus being significantly deteriorated.

In addition, some light emitted from the light-emitting element 13 in an upward direction enters the fluorescent material layer 14 without being incident upon the inner surface 12a. Part of this light undergoes total reflection on the lower surface of the fluorescent material layer 14 at an angle larger than the critical angle. As a result, the efficiency of wavelength conversion effected by the fluorescent material is decreased, which leads to a problem of the radiation light intensity and brightness in the light-emitting apparatus being significantly deteriorated.

SUMMARY OF THE INVENTION

The invention has been devised in view of the above-described problems with the conventional art, and accordingly its object is to provide a light-emitting apparatus and illuminating apparatus that will succeed in offering high radiation light intensity and high brightness by reducing the number of reflections of light emitted from a light-emitting element occurring on the inner surface of a reflection member and by effectively preventing the light emitted from the light-emitting element from undergoing total reflection at the interface of a fluorescent material layer.

The invention provides a light-emitting apparatus comprising:
a light-emitting element;
a base body having a convexity formed on an upper principal surface thereof for emplacing the light-emitting element thereon;
a reflection member disposed on the upper principal surface of the base body so as to surround the convexity, having an inner surface which is formed as a reflection surface for reflecting light emitted from the light-emitting element emplaced on the convexity; and
a fluorescent material layer disposed on a top surface of the reflection member so as to cover the light-emitting element, with a spacing secured between the fluorescent material layer and the light-emitting element, the fluorescent material layer being composed of a light transmitting member that contains a fluorescent material for performing wavelength conversion on the light emitted from the light-emitting element,
wherein a cross section of the inner surface of the reflection member cut by a virtual plane including a virtual axis penetrating a center of the inner surface and perpendicular to the upper principal surface of the base body has a sectional profile defined by a curved line expressed by the following formula, and the inner surface of the reflection member is a curved surface obtained by rotating the curved line about the virtual axis:

$$Z=(cr^2)/[1+\{1-(1+k)c^2r^2\}^{1/2}] \text{ (where } -10 \leq k \leq -0.001, 0.001 \leq c \leq 10)$$

where r represents a radius from the virtual axis to the inner surface; Z represents a height from a lowermost position of the inner surface to a position having a radius r of the inner surface,
and wherein an angle $\theta_1$ which is made by an upper surface of the fluorescent material layer and a line which connects one corner of a light-emitting portion of the light emitting element with an uppermost position of the inner surface and is tangent to the one corner, is given as:

$$\theta_1 \geq 90° - \sin^{-1}(1/n_1)$$

where $n_1$ represents a refractive index of the fluorescent material layer.

The invention provides a light-emitting apparatus comprising:
a light-emitting element;
a platy base body;
a reflection member joined to an upper principal surface of the base body, the reflection member having a base portion, a convexity formed on the base portion, for emplacing thereon the light-emitting element, and a side wall portion formed on a periphery of the base portion so as to surround the convexity, the side wall portion having an inner surface which is formed as a reflection surface for reflecting light emitted from the light-emitting element emplaced on the convexity; and
a fluorescent material layer disposed on a top surface of the, side wall portion so as to cover the light-emitting element, with a spacing secured between the fluorescent material layer and the light-emitting element, the fluorescent material layer being composed of a light transmitting member that contains a fluorescent material for performing wavelength conversion on the light emitted from the light-emitting element,
wherein a cross section of the side wall portion cut by a virtual plane including a virtual axis penetrating a center of the inner surface and perpendicular to the upper principal surface of the base body has a sectional profile defined by a curved line expressed by the following formula, and the inner surface of the reflection member is a curved surface obtained by rotating the curved line about the virtual axis:

$$Z=(cr^2)/[1+\{1-(1+k)c^2r^2\}^{1/2}] \text{ (where } -10 \leq k \leq -0.001, 0.001 \leq c \leq 10)$$

where r represents a radius from the virtual axis to the inner surface; Z represents a height from a lowermost position of the inner surface to a position having a radius r of the inner surface,
and wherein an angle $\theta_1$ which is made by an upper surface of the fluorescent material layer and a line which connects one corner of a light-emitting portion of the light emitting element with an uppermost position of the inner surface and is tangent to the one corner, is given as:

$$\theta_1 \geq 90° - \sin^{-1}(1/n_1)$$

where $n_1$ represents a refractive index of the fluorescent material layer.

In the invention, an arithmetic average roughness Ra of the inner surface is in a range of 0.004 to 4 μm.

In the invention, a spacing bounded by the inner surface of the reflection member and a lower surface of the fluorescent material layer is filled with a light transmitting member composed of the same material as that of the light transmitting member constituting the fluorescent material layer.

The invention provides an illuminating apparatus constructed by setting up a plurality of the above-described light-emitting apparatuses in a predetermined arrangement.

In the invention, the predetermined arrangement is a staggered arrangement.

In the invention, the predetermined arrangement is a concentric arrangement of groups of light-emitting apparatuses which groups of light-emitting apparatuses are circularly or polygonally arranged, and numbers of light-emitting apparatuses of the respective groups become larger gradually from a center to an outer edge of the illuminating apparatus.

According to the invention, the light-emitting apparatus comprises a light-emitting element; a base body having a convexity formed on an upper principal surface thereof for emplacing the light-emitting element thereon; a reflection member disposed on the upper principal surface of the base body so as to surround the convexity, having an inner surface which is formed as a reflection surface for reflecting light emitted from the light-emitting element emplaced on the convexity; and a fluorescent material layer disposed on a top surface of the reflection member so as to cover the light-emitting element with a spacing secured between the fluorescent material layer and the light-emitting element, the fluorescent material layer being composed of a light transmitting member that contains a fluorescent material for performing wavelength conversion on the light emitted from the light-emitting element. The cross section of the inner surface of the reflection member cut by a virtual plane including a virtual axis penetrating a center of the inner surface and perpendicular to the upper principal surface of the base body has a sectional profile defined by a curved line expressed by the following formula, and the inner surface of the reflection member is a curved surface obtained by rotating the curved line about the virtual axis:

$$Z=(cr^2)/[1+\{1-(1+k)c^2r^2\}^{1/2}] \text{ (where } -10 \leq k \leq -0.001, 0.001 \leq c \leq 10)$$

where r represents a radius from the virtual axis to the inner surface; Z represents a height from a lowermost position of the inner surface to a position having a radius r of the inner surface, and the angle $\theta_1$ which is made by an upper surface of the fluorescent material layer and a line which connects one corner of a light-emitting portion of the light emitting element with an uppermost position of the inner surface and is tangent to the one corner, is given as:

$$\theta_1 \geq 90°-\sin^{-1}(1/n_1)$$

where $n_1$ represents a refractive index of the fluorescent material layer. In this way, the light emitted from the light-emitting element is reflected from the inner surface perpendicularly with respect to the fluorescent material layer and enters the fluorescent material layer. As a result, in the light-emitting apparatus, the number of reflections of the light emitted from the light-emitting element occurring on the inner surface can be reduced. Moreover, the light reflected from the inner surface can be prevented from undergoing total reflection on a lower surface of the fluorescent material layer. Accordingly, in the light-emitting apparatus, absorption loss of the light emitted from the light-emitting element can be reduced in the inner surface. Further, light confinement within the light-emitting apparatus can be avoided. This makes it possible to increase the radiation light intensity in the light-emitting apparatus.

Moreover, since the angle $\theta_1$ is given as: $\theta_1 \geq 90°-\sin^{-1}(1/n_1)$, it follows that, for every light that has been emitted from the light-emitting element in an upward direction and entering directly the fluorescent material layer without being reflected from the reflection member, the incident angle can be made smaller than the critical angle. This helps prevent occurrence of total reflection in the fluorescent material layer effectively.

According to the invention, a light-emitting apparatus comprises a light-emitting element; a platy base body; a reflection member joined to an upper principal surface of the base body, the reflection member having a base portion, a convexity formed on the base portion, for emplacing thereon the light-emitting element, and a side wall portion formed on a periphery of the base portion so as to surround the convexity, the side wall portion having an inner surface which is formed as a reflection surface for reflecting light emitted from the light-emitting element emplaced on the convexity; and a fluorescent material layer disposed on a top surface of the side wall portion so as to cover the light-emitting element, with a spacing secured between the fluorescent material layer and the light-emitting element, the fluorescent material layer being composed of a light transmitting member that contains a fluorescent material for performing wavelength conversion on the light emitted from the light-emitting element. The cross section of the side wall portion cut by a virtual plane including a virtual axis penetrating a center of the inner surface and perpendicular to the upper principal surface of the base body has a sectional profile defined by a curved line expressed by the following formula, and the inner surface of the reflection member is a curved surface obtained by rotating the curved line about the virtual axis:

$$Z=(cr^2)/[1+\{1-(1+k)c^2r^2\}^{1/2}] \text{ (where } -10 \leq k \leq -0.001, 0.001 \leq c \leq 10)$$

where r represents a radius from the virtual axis to the inner surface; Z represents a height from a lowermost position of the inner surface to a position having a radius r of the inner surface, and the angle $\theta_1$ which is made by an upper surface of the fluorescent material layer and a line which connects one corner of a light-emitting portion of the light emitting element with an uppermost position of the inner surface and is tangent to the one corner, is given as:

$$\theta_1 \geq 90°-\sin^{-1}(1/n_1)$$

where $n_1$ represents a refractive index of the fluorescent material layer. In this way, the light emitted from the light-emitting element is reflected from the inner surface perpendicularly with respect to the fluorescent material layer and enters the fluorescent material layer. As a result, in the light-emitting apparatus, the number of reflections of the light emitted from the light-emitting element occurring on the inner surface can be reduced. Moreover, the light reflected from the inner surface can be prevented from undergoing total reflection on a lower surface of the fluorescent material layer. Accordingly, in the light-emitting apparatus, absorption loss of the light emitted from the light-emitting element can be reduced in the inner surface. Further, light confinement within the light-emitting apparatus can be avoided. This makes it possible to increase the radiation light intensity in the light-emitting apparatus.

Moreover, heat emanating from the light-emitting element is easily transmitted from the convexity formed integrally with the reflection member to the side wall portion. In particular, where the reflection member is made of a metal, the heat is transmitted to the side wall portion swiftly, so that it may be dissipated from the outer side of the side wall portion to the outside satisfactorily.

Further, the light emitting element is, at its entire bottom surface, joined to the convexity of the reflection member. This makes it possible to transmit the heat emanating from the light-emitting element to the reflection member satisfactorily and thereby improve the heat-dissipation property. As a result, temperature rise can be prevented from occurring in the light-emitting element, whereby making it possible to avoid development of a crack in the joint portion resulting from the difference in thermal expansion between the light emitting element and the reflection member. Moreover, the heat emanating from the light emitting element is allowed to travel not only in the direction of the height of the reflection member but also in the direction of the periphery thereof. Therefore, the heat can be transmitted from the entire lower surface of the reflection member to the base body with high efficiency, thereby preventing temperature rise from occurring in the light-emitting element and the reflection member more effectively. It is thus possible to maintain stable operation of the light-emitting element and to protect the inner surface from thermal deformation. As a result, the light-emitting apparatus can be operated for a longer period of time, with stable optical characteristics maintained successfully.

According to the invention, since an arithmetic average roughness Ra at the top of the inner surface is adjusted to fall in a range of 0.004 to 4 µm, the light emitted from the light-emitting element can be reflected successfully from the inner surface as a reflection surface.

According to the invention, a spacing bounded by the inner surface of the reflection member and a lower surface of the fluorescent material layer is filled with a light transmitting member composed of the same material as that of the light transmitting member constituting the fluorescent material layer. This helps reduce the difference in refractive index between the inner and outer parts of the light-emitting element, and thereby as much light as possible can be taken out of the light-emitting element. The light-emitting apparatus will thus succeed in effecting light emission more satisfactorily, and the radiation light intensity and brightness can be improved remarkably.

According to the invention, the illuminating apparatus is constructed by setting up a plurality of the above-described light-emitting apparatuses of the invention in a predetermined arrangement. In such the illuminating apparatus, light emission is effected by exploiting recombination of electrons in the light-emitting element formed of a semiconductor. Thus, there is provided a compact illuminating apparatus that has the advantage, in terms of power saving and long lifetime, over a conventional illuminating apparatus for effecting light emission through electrical discharge. As a result, variation in the center wavelength of the light emitted from the light-emitting element can be suppressed; wherefore the illuminating apparatus will succeed in irradiating light with stable radiation light intensity and angle (luminous intensity distribution) for a longer period of time, and in avoiding color unevenness and unbalanced illumination distribution on a to-be-irradiated surface.

Moreover, by setting up a plurality of the light-emitting apparatuses of the invention in a predetermined arrangement, with the light emitted from the light-emitting element or the light emitted from the upper surface of the fluorescent material layer acting as a light source, followed by arranging around the light-emitting apparatuses optical components optically designed in a given configuration such as a reflection jig, an optical lens, or a light diffusion plate, it is possible to realize an illuminating apparatus capable of emitting light with given luminous intensity distribution.

According to the invention, since the predetermined arrangement is a staggered arrangement, it is possible to suppress glare and thereby reduce discomfort or trouble to human eyes. Another advantage is that, since the spacing between the adjacent light-emitting apparatuses can be kept as long as possible, it will be possible to effectively suppress thermal interference between the adjacent light-emitting apparatuses. Hence, heat confinement can be avoided around the lower part of the light-emitting apparatus; wherefore heat can be dissipated from the light-emitting apparatus to the outside with high efficiency. As a result, there can be provided a long-life illuminating apparatus that has little adverse effect on human eyes and offers stable optical characteristics for a longer period of time.

According to the invention, the predetermined arrangement is a concentric arrangement of groups of light-emitting apparatuses which groups of light-emitting apparatuses are circularly or polygonally arranged, and numbers of the light-emitting apparatuses becomes larger gradually from a center to an outer edge of the illuminating apparatus. This makes it possible to arrange the light-emitting apparatuses as many as possible, with the spacing between the adjacent light-emitting apparatuses secured appropriately, and thereby enhance the illumination level of the illuminating apparatus. Moreover, by lowering the density of the light-emitting apparatuses in the midportion of the illuminating apparatus, it is possible to avoid heat confinement in the midportion of the illuminating apparatus. Hence, the illuminating apparatus in which the light-emitting apparatuses are mounted exhibits uniform temperature distribution. Thus, heat can be transmitted to an external electric circuit board or a heat sink with the illuminating apparatus with high efficiency, thereby preventing temperature rise from occurring in the light-emitting apparatuses. As a result, there can be provided a long-life illuminating apparatus in which the light-emitting apparatuses can be operated with stability for a longer period of time.

BRIEF DESCRIPTION OF THE DRAWINGS

Other and further objects, features, and advantages of the invention will be more explicit from the following detailed description taken with reference to the drawing wherein.

DETAILED DESCRIPTION OF THE PREFERRED EMBODIMENTS

Now referring to the drawings, preferred embodiments of the invention are described below.

Figure 1:
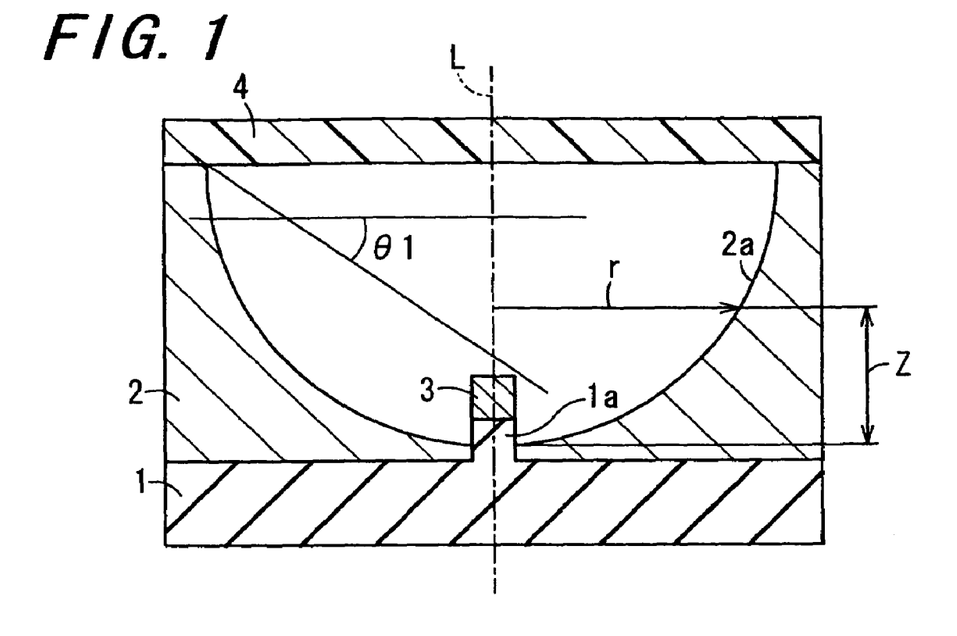
FIG. 1 is a sectional view showing a light-emitting apparatus in accordance with first embodiment of the invention.

Now, a detailed description will be given below as to a light-emitting apparatus according to the invention. FIG. 1 is a sectional view showing the light-emitting apparatus in accordance with first embodiment of the invention. In the figure, the light-emitting apparatus comprises a base body 1, a reflection member 2, a light-emitting element 3, and a fluorescent material layer 4. On the upper part of the reflection member 2 is arranged the fluorescent material layer 4 for performing wavelength conversion on light emitted from a light-emitting element 3.

The base body 1 has a convexity formed on an upper principal surface thereof for emplacing the light-emitting element 3 thereon. The base body 1 is provided with a wiring conductor (not shown) formed of, for example, a metallized wiring line and a lead terminal for electrically conductively connecting within and without the light-emitting apparatus through the placement portion 1b and its environs. The reflection member 2 is disposed on a periphery of the upper principal surface of the base body 1 so as to surround the convexity 1a, having an inner surface 2a of which is formed as a reflection surface for reflecting light emitted from the light-emitting element 3. The fluorescent material layer 4 is disposed on a top surface of the reflection member 2 so as to cover the light-emitting element 3, with a spacing secured between the fluorescent material layer 4 and the light-emitting element 3. The fluorescent material layer 4 is also composed of a light transmitting member that contains a fluorescent material for performing wavelength conversion on the light emitted from the light-emitting element 3.

The base body 1 is made of a ceramic material such as alumina ceramics, sintered aluminum nitride, sintered mullite, or glass ceramics, or a metal material such as an Fe—Ni—Co alloy or Cu—W alloy, or a resin material such as epoxy resin. The base body 1 has the convexity 1a formed on a top surface as the upper principal surface thereon, for emplacing thereon the light-emitting element 3.

Onto the top surface of the base body 1 is attached the reflection member 2 so as to surround the convexity 1a with use of a bonding material such as solder, a brazing filler material such as Ag brazing filler, or an epoxy-resin adhesive. The reflection member 2 is attached around the light-emitting element 3, with its inner surface 2a arranged with desired surface accuracy (specifically, for example, the reflection member 2 is attached such that its inner surface 2a as reflection surfaces disposed on both sides of the light-emitting element 3 are symmetrical with each other, when viewed in the vertical section of the light-emitting apparatus). This makes it possible to allow the light emitted from the light-emitting element 3 to be reflected evenly from the inner surface 2a. The radiation light intensity and brightness can accordingly be improved effectively. An opening of the reflection member 2 which exposes the inner surface 2a forms a round circle.

A cross section of the inner surface 2a of the reflection member 2 cut by a virtual plane including a virtual axis L penetrating a center of the inner surface 2a and perpendicular to the upper principal surface of the base body 1 has a sectional profile defined by a curved line expressed by the following formula, and the inner surface of the reflection member 2 is a curved surface obtained by rotating the curved line about the virtual axis:

$$Z=(cr^2)/[1+\{1-(1+k)c^2r^2\}^{1/2}] \text{ (where } -10 \leq k \leq -0.001, 0.001 \leq c \leq 10)$$

where r represents a radius from the virtual axis L to the inner surface 2a, i.e., a radius of an inner dimension; Z represents a height from a lowermost position of the inner surface 2a to a position having a radius r of the inner surface 2a, and an angle $\theta_1$ which is made by an upper surface of the fluorescent material layer 4 and a line which connects one corner of a light-emitting portion of the light emitting element 3 with an uppermost position of the inner surface 2a and is tangent to the one corner, is given as:

$$\theta_1 \geq 90° - \sin^{-1}(1/n_1)$$

where $n_1$ represents a refractive index of the fluorescent material layer 4. In this way, the reflection member 2 is allowed to reflect the light emitted from the light-emitting element 3 perpendicularly with respect to the fluorescent material layer 4. Thus, the number of reflections of the light emitted from the light-emitting element 3 occurring on the inner surface 2a can be reduced. Moreover, the light reflected from the inner surface 2a can be prevented from undergoing total reflection on a lower surface of the fluorescent material layer 4. Further, the light that has been emitted from the light-emitting element 3 in an upward direction and entered the fluorescent material layer 4 without being reflected from the inner surface 2a can be prevented from undergoing total reflection at the interface of the fluorescent material layer 4. Accordingly, absorption loss of the light emitted from the light-emitting element 3 can be reduced in the inner surface 2a. Moreover, light confinement within the reflection member 2 can be avoided. As a result, it is possible to allow light to radiate out of the light-emitting apparatus with high efficiency, and to increase the radiation light intensity.

Here, given the constant k of less than −10 or the constant c of less than 0.001, then the configuration of the inner surface 2a is made close to a straight line. In this case, part of the light that has been emitted from the light-emitting element 3 and then reflected from the inner surface 2a enters the lower surface of the fluorescent material layer 4 at a larger incident angle, which results in an undesirable increase in reflection loss. Furthermore, part of the light that has been emitted from the light-emitting element 3 and then reflected from the inner surface 2a enters the lower surface of the fluorescent material layer 4 at an incident angle larger than the critical reflection angle. This causes total reflection, and thus the light is confined within the light-emitting apparatus without undergoing wavelength conversion effected by the fluorescent material layer 4. As a result, radiation of light to the outside becomes insufficient, and also the radiation light intensity in the light-emitting apparatus is decreased.

On the other hand, given the constant k of greater than −0.001 or the constant c of greater than 10, then the curvature of the sectional profile of the inner surface 2a is increased. This makes it difficult to reflect the light emitted from the light-emitting element 3 in a vertical direction, and also causes a significant increase of diffused reflection of light within the reflection member 2. Furthermore, the opening of the reflection member 2 is smaller in size and correspondingly the surface area of the fluorescent material layer 4 is decreased. This leads to an undesirable reduction of the proportion of the fluorescent materials (not shown) to be excited by the light emitted from the light-emitting element 3. As a result, the efficiency of wavelength conversion performed on the light emitted from the light-emitting element 3 by the fluorescent material layer 4 is significantly decreased. This causes an undesirable reduction of the radiation light intensity in the light-emitting apparatus.

The preferred examples of materials used for the convexity 1a include: a ceramic material such as alumina ceramics, sintered aluminum nitride, sintered mullite, or glass ceramics; a metal material such as an Fe—Ni—Co alloy or Cu—W alloy; and a resin material such as epoxy resin. The convexity 1a can be formed by attaching a structural element made of the aforementioned ceramic, metal, or resin material onto the top surface of the base body 1 with use of a bonding material such as a brazing filler material or an adhesive, or formed by fitting the structural element into a through hole drilled at the center of the base body 1 in such a way that the upper part thereof extends from the top surface of the base body 1.

Preferably, the convexity 1a and the base body 1 are made of the same material. This makes it possible to minimize the difference in thermal expansion between the convexity 1a and the base body 1. Thus, it never occurs that the light-emitting element 3 is positionally deviated due to occurrence of distortion in the convexity 1a, and reduction of the light emission intensity can be avoided effectively.

The convexity 1a may be formed integrally with the base body 1. In this case, for example, the one-piece structure of the convexity 1a and the base body 1 may be formed by stacking together ceramic green sheets to be formed into the convexity 1a and the base body 1, followed by firing them at one time, or formed by performing a metal processing operation such as cutting process, or formed by molding a resin material by means of injection molding or the like method.

On the convexity 1a is formed an electrical connection pattern (not shown) for providing electrical connection of the light-emitting element 3. The electrical connection pattern is led out, through a wiring layer (not shown) formed within the base body 1, to the outer surface of the light-emitting apparatus. Upon this electrical connection pattern being connected to an external electric circuit board, electrical connection is established between the light-emitting element 3 and the external electric circuit.

The light-emitting element 3 is constituted by forming a light-emitting layer on a monocrystalline substrate such as a sapphire substrate by means of the liquid-phase growth method or MOCVD method. The examples of materials used for the light-emitting layer include: a gallium (Ga)—Al-nitride (N) compound; a zinc (Zn)-sulfur (S) compound; a Zn-selenium (Se) compound; a silicon (Si)-carbon (C) compound; a Ga-phosphorus (P) compound; a Ga—Al-arsenic (As) compound; an Al-indium (In)—Ga—P compound; an In—Ga—N compound; a Ga—N compound; and an Al—In—Ga—N compound. The light-emitting element 3 may have a homo structure, a hetero structure, or a double-hetero structure including an MIS junction or PN junction. The luminescence wavelength of the light-emitting element 3 shall be selected according to the material used for the light-emitting layer and its mix crystal ratio, for example, in a range from ultraviolet to infrared regions.

The fluorescent material layer 4 is composed of a fluorescent material capable of performing wavelength conversion on the light emitted from the light-emitting element 3 and a light transmitting member such as epoxy resin or silicone resin. The fluorescent material layer 4 is formed by molding the material in the shape of a film or plate, followed by performing heat-hardening thereon in an oven or the like equipment. The fluorescent material layer 4 is arranged above the reflection member 2. By performing wavelength conversion on the light emitted from the light-emitting element 3 by the fluorescent material contained in the fluorescent material layer 4, it is possible to take out light having a desired wavelength spectrum.

Figure 2:
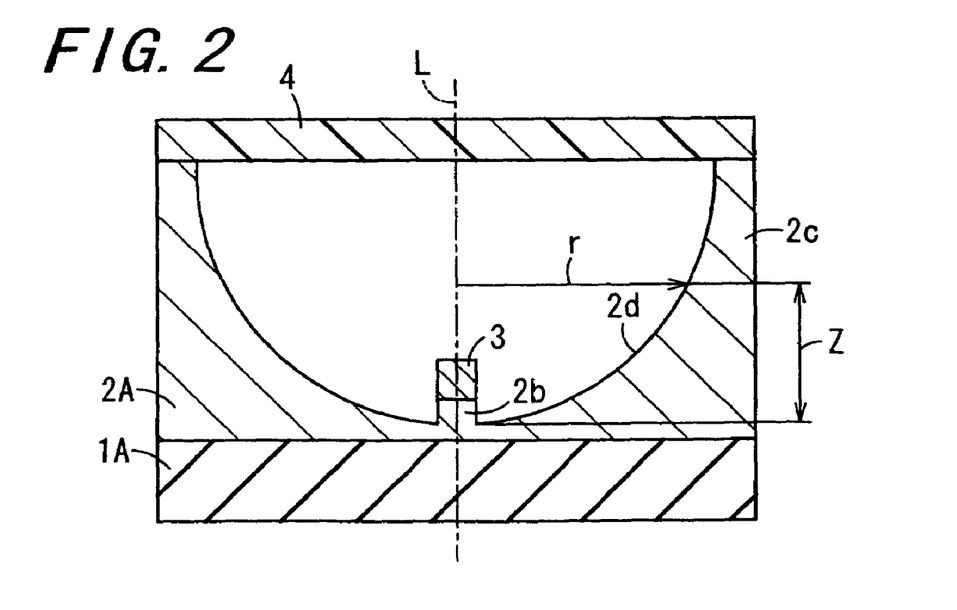
FIG. 2 is a sectional view showing a light-emitting apparatus in accordance with second embodiment of the invention.

FIG. 2 is a sectional view showing a light-emitting apparatus in accordance with a second embodiment of the invention. In the embodiment, the corresponding component will be denoted by the same reference numeral and a description thereof will be omitted. The light-emitting apparatus comprises a platy base body 1A, a reflection member 2A, a light-emitting element 3, and a fluorescent material layer 4.

The reflection member 2A is joined to an upper principal surface of the base body 1A, and on a base portion of the reflection member 2A is formed a convexity 2b for emplacing thereon the light-emitting element 3. The reflection member 2A has a side wall portion 2c is formed on a periphery of the base portion so as to surround the convexity 2b, and has an inner surface 2d which is formed as a reflection surface for reflecting light emitted from the light-emitting element 3 emplaced on the convexity 2b. In the embodiment, the fluorescent material layer 4 is disposed on a top surface of the side wall portion 2c so as to cover the light-emitting element 3, with a spacing secured between the fluorescent material layer 4 and the light-emitting element 3. An opening of the reflection member 2A which exposes the inner surface 2d forms a round circle.

Moreover, as shown in FIG. 2, a cross section of the side wall portion 2c of the reflection member 2A cut by a virtual plane including a virtual axis L penetrating a center of the inner surface 2d and perpendicular to the upper principal surface of the base body 1A has a sectional profile defined by a curved line expressed by the following formula, and the inner surface 2d of the reflection member 2A is a curved surface obtained by rotating the curved line about the virtual axis:

$$Z=(cr^2)/[1+\{1-(1+k)c^2r^2\}^{1/2}] \text{ (where } -10 \leq k \leq -0.001, 0.001 \leq c \leq 10)$$

where r represents a radius from the virtual axis L to the inner surface 2d, i.e., a radius of an inner dimension; Z represents a height from a lowermost position of the inner surface 2d to a position having a radius r of the inner surface 2d, and an angle $\theta_1$ which is made by an upper surface of the fluorescent material layer 4 and a line which connects one corner of a light-emitting portion of the light emitting element 3 with an uppermost position of the inner surface 2d and is tangent to the one corner, is given as:

$$\theta_1 \geq 90° - \sin^{-1}(1/n_1)$$

where $n_1$ represents a refractive index of the fluorescent material layer 4.

In this way, the light emitting element 3 is, at its entire bottom surface, joined to the top surface of the convexity 2b of the reflection member 2A. This makes it possible to transmit the heat emanating from the light emitting element 3 to the reflection member 2A satisfactorily and thereby improve the heat-dissipation property. Moreover, the heat emanating from the light emitting element 3 is allowed to travel satisfactorily not only in the direction of the height of the reflection member 2A but also in the direction of the periphery thereof. Thus, the heat can be transmitted from the entire bottom surface of the reflection member 2A to the base body 1A with high efficiency, thereby preventing temperature rise from occurring in the light-emitting element 3 and the reflection member 2A more effectively. Since temperature rise can be prevented from occurring in the light-emitting element 3, it is possible to avoid wavelength variation and deterioration of the optical power caused by the heat emanating from the light emitting element 3. It is also possible to avoid development of a crack in the joint portion resulting from the difference in thermal expansion between the light emitting element 3 and the reflection member 2A. Further, since temperature rise can be prevented from occurring in the reflection member 2 effectively, it is possible to protect the inner surface 2d from deformation. As a result, in the light-emitting apparatus, high reliability and stable optical characteristics can be maintained for a longer period of time.

Here, given the constant k of less than −10 or the constant c of less than 0.001, then the configuration of the inner surface 2d is made close to a straight line. In this case, part of the light that has been emitted from the light-emitting element 3 and then reflected from the inner surface 2d enters the lower surface of the fluorescent material layer 4 at a larger incident angle, which results in an undesirable increase in reflection loss. Furthermore, part of the light that has been emitted from the light-emitting element 3 and then reflected from the inner surface 2d enters the lower surface of the fluorescent material layer 4 at an incident angle larger than the critical reflection angle. This causes total reflection, and thus the light is confined within the light-emitting apparatus without undergoing wavelength conversion effected by the fluorescent material layer 4. As a result, radiation of light to the outside becomes insufficient, and thus the radiation light intensity in the light-emitting apparatus is decreased.

On the other hand, given the constant k of greater than −0.001 or the constant c of greater than 10, then the curvature of the sectional profile of the inner surface 2d is increased. This makes it difficult to reflect the light emitted from the light-emitting element 3 in the vertical direction, and also causes a significant increase of diffused reflection of light within the reflection member 2A. Furthermore, the opening of the reflection member 2A is smaller in size and correspondingly the surface area of the fluorescent material layer 4 is decreased. This leads to an undesirable reduction of the proportion of the fluorescent materials to be excited by the light emitted from the light-emitting element 3. As a result, the efficiency of wavelength conversion performed on the light emitted from the light-emitting element 3 by the fluorescent material layer 4 is significantly decreased. This causes an undesirable reduction of the radiation light intensity in the light-emitting apparatus.

The convexity 2b may be formed by attaching a structural element made of a ceramic material such as alumina ceramics, sintered aluminum nitride, sintered mullite, or glass ceramics, or a metal material such as an Fe—Ni—Co alloy or Cu—W alloy, or a resin material such as epoxy resin to the lower end of the inner surface 2d of the reflection member 2A with use of a bonding material such as a brazing filler material or an adhesive.

In FIG. 1 and FIG. 2 of the embodiments of the invention, the inner surface 2a, 2d is shaped into a reflection surface for reflecting the light emitted from the light-emitting element 3. In a case where the reflection member 2, 2A is made of a high-reflectivity metal such as Al, Ag, Au, platinum (Pt), titanium (Ti), chromium (Cr), or Cu, the inner surface 2a, 2d is formed by performing cutting or die-molding process on the reflection member 2, 2A. On the other hand, in a case where the reflection member 2, 2A is made of an insulating material such as ceramics or resin, the inner surface 2a, 2d may be formed by coating the reflection member 2, 2A with a thin film made of a high-reflectivity metal such as Al, Ag, Au, platinum (Pt), titanium (Ti), chromium (Cr), or Cu with use of plating or vapor deposition (this is true for the case where the reflection member 2, 2A is made of a metal). In a case where the inner surface 2a, 2d is formed of a metal that is susceptible to discoloration resulting from oxidation, such as Ag or Cu, it is preferable to laminate on its surface for example a 1 to 10 μm-thick Ni plating layer and a 0.1 to 3 μm-thick Au plating layer successively by the electrolytic plating method or electroless plating method. Thereby, the corrosion resistance of the inner surface 2a, 2d can be enhanced.

Moreover, an arithmetic average roughness Ra at the top of the inner surface 2a, 2d is preferably adjusted to fall in a range of 0.004 to 4 μm. This allows the inner peripheral surface 2a, 2d as a reflection surface to reflect the light emitted from the light-emitting element 3 satisfactorily. If Ra exceeds 4 μm, the light emitted from the light-emitting element 3 cannot be reflected uniformly, and thus diffuse reflection takes place within the reflection member 2, 2A. By contrast, if Ra is less than 0.004 μm, it will be difficult to obtain such a desired reflection surface as functioning properly with stability and high efficiency.

Further, the light-emitting element 3 is electrically connected to the wiring conductor formed on the base body 1, 1A by the wire-bonding method or the flip-chip bonding method. According to the flip-chip bonding method, the light-emitting element 3 is arranged with the electrode side down, and connection is established between the electrode and the wiring conductor through a solder bump. The flip-chip bonding method is more desirable for connection. By adopting such methods, the wiring conductor can be disposed immediately below the light-emitting element 3. This eliminates the need to secure an extra space for disposing the wiring conductor around the light-emitting element 3 on the top surface of the base body 1, 1A. Hence, it never occurs that the light emitted from the light-emitting element 3 is absorbed in the space of the base body 1, 1A secured for the wiring conductor. Accordingly, an undesirable decrease in the radiation light intensity can be avoided effectively.

For example, the wiring conductor is obtained by forming a metallized layer made of powder of a metal such as W, Mo, Cu, or Ag, or obtained by burying a lead terminal made of a metal such as an Fe—Ni—Co alloy, or obtained by fitting an input/output terminal formed of an insulator carrying the wiring conductor into a through hole drilled in the base body 1, 1A.

It is preferable that the wiring conductor has its exposed surface coated with a highly corrosion-resistant metal such as Ni or Au in the thickness ranging from 1 to 20 μm. This makes it possible to protect the wiring conductor against oxidative corrosion effectively, and to strengthen the connection between the light-emitting element 3 and the wiring conductor. Accordingly, the exposed surface of the wiring conductor should preferably be coated with for example a 1 to 10 μm-thick Ni plating layer and a 0.1 to 3 μm-thick Au plating layer successively by the electrolytic plating method or electroless plating method.

Figure 3:
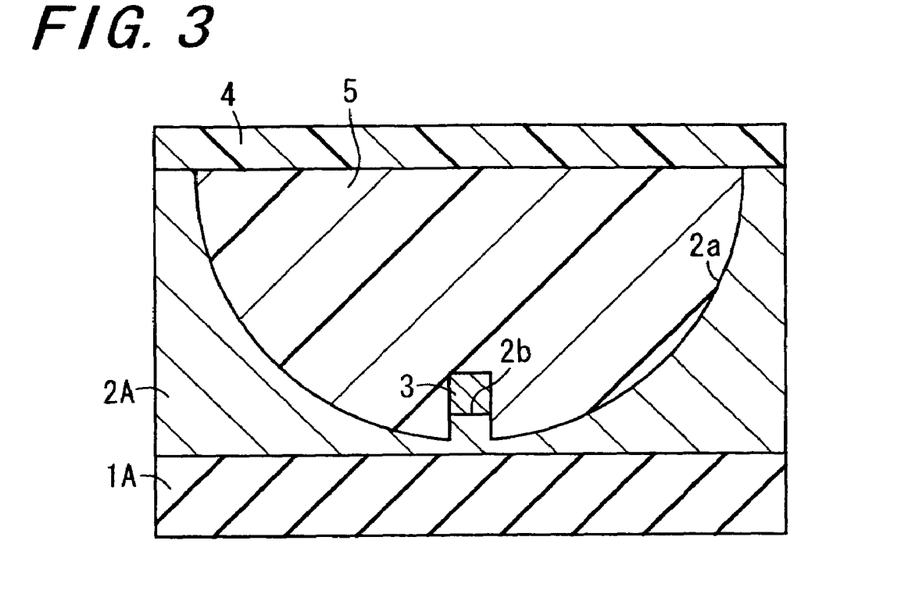
FIG. 3 is a sectional view showing a light-emitting apparatus in accordance with third embodiment of the invention.

FIG. 3 is a sectional view showing a light-emitting apparatus in accordance with a third embodiment of the invention. The light-emitting apparatus of the embodiment is similar to that of the second embodiment of the invention, therefore the corresponding component will be denoted by the same reference numeral and a description thereof will be omitted.

It is more preferable that, as shown in FIG. 3, the region surrounded by the reflection member 2A and the fluorescent material layer 4, that is, a spacing bounded by the inner surface 2d of a reflection member 2A and the lower surface of the fluorescent material layer 4 is filled with a light transmitting member 5 composed of the same material as that of the light transmitting member constituting the fluorescent material layer 4, such as epoxy resin or silicone resin, and the light-emitting element 3 is covered. This helps reduce the difference in refractive index between the inner and outer parts of the light-emitting element 3, and thereby as much light as possible can be taken out of the light-emitting element 3. The light-emitting apparatus will thus succeed in effecting light emission more satisfactorily, and the radiation light intensity and brightness can be improved remarkably.

The same constitution also applies to the light-emitting apparatus according to the first embodiment of the invention shown in FIG. 1. That is, the region surrounded by the reflection member 2 and the fluorescent material layer 4, that is, a spacing bounded by the inner surface 2a of a reflection member 2 and the lower surface of the fluorescent material layer 4 may be filled with a light transmitting member 5 composed of the same material as that of the light transmitting member constituting the fluorescent material layer 4, such as epoxy resin or silicone resin, and the light-emitting element 3 is covered.

The light-emitting apparatus embodying the invention may be used to constitute an illuminating apparatus. For example, as shown in FIGS. 5A to 5E, the illuminating apparatus is constituted by setting up a plurality of the light-emitting apparatuses in a predetermined arrangement such as a lattice, staggered, or radial arrangement, a concentric arrangement of groups of light-emitting apparatuses which groups of light-emitting apparatuses are circularly or polygonally arranged. In the illuminating apparatus thus constructed, light emission is effected by exploiting recombination of electrons in the light-emitting element 3 composed of a semiconductor. Thus, the illuminating apparatus has the advantage, in terms of power saving and long lifetime, over a conventional illuminating apparatus for effecting light emission through electrical discharge A compact, low heat-generation illuminating apparatus can accordingly be realized. As a result, variation in the center wavelength of the light emitted from the light-emitting element 3 can be suppressed; wherefore the illuminating apparatus is capable of irradiating light with stable radiation light intensity and radiation light angle (luminous intensity distribution) for a longer period of time, and is also capable of avoiding color unevenness and unbalanced illumination distribution on a to-be-irradiated surface.

Moreover, by setting up a plurality of the light-emitting apparatuses of the invention in a predetermined arrangement, with the light emitted from the light-emitting element 3 or the light emitted from the upper surface of the fluorescent material layer 4 acting as a light source, followed by arranging around the light-emitting apparatuses optical components optically designed in a given configuration such as a reflection jig, an optical lens, or a light diffusion plate, it is possible to realize an illuminating apparatus capable of emitting light with given luminous intensity distribution.

For example, in an illuminating apparatus composed of a plurality of the light-emitting apparatuses arranged in a plurality of rows, adjacent arrays of a plurality of the light-emitting apparatuses are preferably so arranged as to secure as sufficient a spacing as possible between the adjacent light-emitting elements 3, that is; the light-emitting apparatuses are preferably staggered. If the light-emitting apparatuses are disposed in a lattice arrangement, that is; the light-emitting apparatuses acting as light sources are arranged rectilinearly, glare will be intensified. An illuminating apparatus having such a lattice arrangement of the light-emitting apparatuses tends to bring discomfort or trouble to human eyes. In view of the foregoing, the light-emitting apparatuses are disposed in a staggered arrangement and thereby, it is possible to suppress glare and thereby reduce discomfort and trouble to human eyes. Another advantage is that, since the spacing between the adjacent light-emitting apparatuses can be kept as long as possible, it will be possible to effectively suppress thermal interference between the adjacent light-emitting apparatuses. Hence, heat confinement can be avoided around the lower part of the light-emitting apparatus; wherefore heat can be dissipated from the light-emitting apparatus to the outside with high efficiency. As a result, there can be provided a long-life illuminating apparatus that has little adverse effect on human eyes and offers stable optical characteristics for a longer period of time.

On the other hand, in an illuminating apparatus constituted by a concentric arrangement of groups of light-emitting apparatuses which groups of light-emitting apparatuses are circularly or polygonally arranged, it is preferable that, in the respective groups of light-emitting apparatuses which group of light-emitting apparatuses is circularly or polygonally arranged, the numbers of light-emitting apparatuses of the respective groups become larger gradually from the center to the outer edge of the illuminating apparatus. This makes it possible to arrange the light-emitting apparatuses as many as possible, with the spacing between the adjacent light-emitting apparatuses secured appropriately, and thereby enhance the illumination level of the illuminating apparatus. Moreover, by lowering the density of the light-emitting apparatuses in the midportion of the illuminating apparatus, it is possible to avoid heat confinement in the midportion of the illuminating apparatus. Hence, the illuminating apparatus in which the light-emitting apparatuses are mounted exhibits uniform temperature distribution. Thus, heat can be transmitted to an external electric circuit board and a heat sink with the illuminating apparatus with high efficiency, thereby preventing temperature rise from occurring in the light-emitting apparatuses. As a result, there can be provided a long-life illuminating apparatus in which the light-emitting apparatuses can be operated with stability for a longer period of time.

The illuminating apparatus such as shown herein will find a wider range of applications including: general-purpose lighting fixtures for indoor or outdoor use: illumination lamps for chandeliers; home-use lighting fixtures; office-use lighting fixtures; store-use lighting fixtures; lighting fixtures for display; street lighting fittings; guidance lights; signal devices; lighting fixtures for stage or studio use; advertisement lights; illumination poles; underwater illumination lights; stroboscopic lights; spotlights; security lighting fixtures embedded in electric poles or the like; lighting fixtures for emergency; electric bulletin boards; dimmers; automatic blink switches; backlights for display or other purposes; motion picture devices; ornamental articles; illuminated switches; light sensors; electric torches; lights for medical use; and vehicle-mounted lights.

EXAMPLE

Hereinafter, a description will be given as to an example of the light-emitting apparatus of the invention.

At first, as the base body 1, an alumina ceramic substrate was prepared. Note that the base body 1 has the convexity 1a formed integrally therewith. The top surface of the convexity 1a is aligned with the top surface of the base body 1 excluding the part in which the convexity 1a *is formed.*

The base body 1 is composed of a rectangular parallelepiped plate which is 8 mm in width×8 mm in depth×0.5 mm in thickness. The base body 1 has, at the center of its top surface, the rectangular-parallelepiped convexity 1a which is 0.35 mm in width×0.35 mm in depth×0.15 mm in thickness.

In that part of the convexity 1a which carries the light-emitting element 3 was formed a wiring conductor for electrically connecting the light-emitting element 3 to the external electric circuit board through an internal wiring line formed within the base body 1. The wiring conductor was shaped into a circular pad having a diameter of 0.1 mm with use of a metallized layer made of Mo—Mn powder. The wiring conductor has its surface coated with a 3 μm-thick Ni plating layer and a 2 μm-thick Au plating layer successively. Moreover, the internal wiring line formed within the base body 1 was constituted by an electrical connection portion formed of a through conductor, i.e. a so-called through hole. Alike to the wiring conductor, the through hole was also formed of a metallized layer made of Mo—Mn powder.

Moreover, the reflection member 2 was prepared. The reflection member 2 is so designed that the diameter at the uppermost end of the inner surface 2a is 6 mm; the height is 1.5 mm; and the height of the lowed end of the inner surface 2a (the distance (height) between the bottom surface to be bonded to the top surface of the base body 1 and the lower edge of the slant surface of the inner surface 2a) is 0.1 mm. Here, the configuration of the inner surface 2a was determined in conformance with the sectional profile of the reflection member 2 of the invention. Specifically, in the formula defining the configuration, the constant k is set at −1.603, and the curvature c is set at 1.538. The arithmetic average roughness Ra at the top of the inner surface 2a was set at 0.1 μm.

Next, an Au—Sn bump was disposed on the wiring conductor formed on the top surface of the base body 1 opposed to the electrode of the light-emitting element 3. Through the Au—Sn bump, the light-emitting element 3 was joined to the wiring conductor. Concurrently, the reflection member 2 was joined to the periphery of the base body 1 so as to surround the convexity 1a with use of a resin adhesive.

Further, transparent silicone resin was charged inside the reflection member 2 by a dispenser, followed by being cured with heat in an oven.

Next, a 0.5 mm-thick platy fluorescent material layer 4 was disposed so as to cover the opening of the reflection member 2. The fluorescent material layer 4 is composed of transparent silicone resin that contains fluorescent materials of three different types that emit red light, green light, and blue light individually.

For purposes of comparison, another light-emitting apparatus was fabricated as shown in FIG. 4. The construction has basically the same structure as the one explained above, except that the inner surface of the reflection member has a sectional profile defined by a linear slant surface and that the reflection member 12 is filled with transparent silicone resin.

Then, each of the light-emitting apparatuses thus constructed was turned on, with a current of 20 mA applied thereto, to measure the quantity of total light beams. The measurement results were 8.51 m/W for the light-emitting apparatus of comparative example as shown in FIG. 4, whereas 21 m/W for the light-emitting apparatus having the structure as shown in FIG. 1. These two light-emitting apparatuses have the same outer dimension. That is, it has been confirmed that the light-emitting apparatus of the invention has the advantage over the comparative example in that its light beam quantity in total is 2.5 times as much as that of the comparative example.

It is to be understood that the application of the invention is not limited to the specific embodiments described heretofore, and that many modifications and variations of the invention are possible within the spirit and scope of the invention.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A light-emitting apparatus comprising:
   a light-emitting element;
   a base body having a convexity formed on an upper principal surface thereof for emplacing the light-emitting element thereon;
   a reflection member disposed on the upper principal surface of the base body so as to surround the convexity, having an inner surface which is formed as a reflection surface for reflecting light emitted from the light-emitting element emplaced on the convexity; and
   a fluorescent material layer disposed on a top surface of the reflection member so as to cover the light-emitting element, with a spacing secured between the fluorescent material layer and the light-emitting element, the fluorescent material layer being composed of a light transmitting member that contains a fluorescent material for performing wavelength conversion on the light emitted from the light-emitting element,
   wherein a cross section of the inner surface of the reflection member cut by a virtual plane including a virtual axis penetrating a center of the inner surface and perpendicular to the upper principal surface of the base body has a sectional profile defined by a curved line expressed by the following formula, and the inner surface of the reflection member is a curved surface obtained by rotating the curved line about the virtual axis:

$Z=(cr^2)/[1+\{1-(1+k)c^2r^2\}^{1/2}]$ (where $-10 \leq k \leq -0.001$, $0.001 \leq c \leq 10$)

where r represents a radius from the virtual axis to the inner surface; Z represents a height from a lowermost position of the inner surface to a position having a radius r of the inner surface,
   and wherein an angle $\theta_1$ which is made by an upper surface of the fluorescent material layer and a line which connects one corner of a light-emitting portion of the light emitting element with an uppermost position of the inner surface and is tangent to the one corner, is given as:

$\theta_1 \geq 90° - \sin^{-1}(1/n_1)$ where $n_1$ represents a refractive index of the fluorescent material layer.

2. The light-emitting apparatus of claim 1, wherein an arithmetic average roughness Ra of the inner surface is in a range of 0.004 to 4 μm.

3. The light-emitting apparatus of claim 1, wherein a spacing bounded by the inner surface of the reflection member and a lower surface of the fluorescent material layer is filled with a light transmitting member composed of a same material as that of the light transmitting member constituting the fluorescent material layer.

4. A light-emitting apparatus comprising:
   a light-emitting element;
   a platy base body;
   a reflection member joined to an upper principal surface of the base body, the reflection member having a base portion, a convexity formed on the base portion, for emplacing thereon the light-emitting element, and a side wall portion formed on a periphery of the base portion so as to surround the convexity, the side wall portion having an inner surface which is formed as a reflection surface for reflecting light emitted from the light-emitting element emplaced on the convexity; and
   a fluorescent material layer disposed on a top surface of the side wall portion so as to cover the light-emitting element, with a spacing secured between the fluorescent material layer and the light-emitting element, the fluorescent material layer being composed of a light transmitting member that contains a fluorescent material for performing wavelength conversion on the light emitted from the light-emitting element, wherein a cross section of the side wall portion cut by a virtual plane including a virtual axis penetrating a center of the inner surface and perpendicular to the upper principal surface of the base body has a sectional profile defined by a curved line expressed by the following formula, and the inner surface of the reflection member is a curved surface obtained by rotating the curved line about the virtual axis:

$$Z=(cr^2)/[1+\{1-(1+k)c^2r^2\}^{1/2}] \text{ (where } -10 \leq k \leq -0.001, 0.001 \leq c \leq 10)$$

where r represents a radius from the virtual axis to the inner surface; Z represents a height from a lowermost position of the inner surface to a position having a radius r of the inner surface, and wherein an angle $\theta_1$ which is made by an upper surface of the fluorescent material layer and a line which connects one corner of a light-emitting portion of the light emitting element with an uppermost position of the inner surface and is tangent to the one corner, is given as:

$$\theta_1 \geq 90° - \sin^{-1}(1/n_1)$$

where $n_1$ represents a refractive index of the fluorescent material layer.

5. The light-emitting apparatus of claim 4, wherein an arithmetic average roughness Ra of the inner surface is in a range of 0.004 to 4 µm.

6. The light-emitting apparatus of claim 4, wherein a spacing bounded by the inner surface of the reflection member and a lower surface of the fluorescent material layer is filled with a light transmitting member composed of a same material as that of the light transmitting member constituting the fluorescent material layer.

7. An illuminating apparatus constructed by setting up a plurality of the light-emitting apparatuses of claim 1 in a predetermined arrangement.

8. The illuminating apparatus of claim 7, wherein the predetermined arrangement is a staggered arrangement.

9. The illuminating apparatus of claim 7, wherein the predetermined arrangement is a concentric arrangement of groups of light-emitting apparatuses which groups of light-emitting apparatuses are circularly or polygonally arranged, and numbers of light-emitting apparatuses of the respective groups become larger gradually from a center to an outer edge of the illuminating apparatus.

10. An illuminating apparatus constructed by setting up a plurality of the light-emitting apparatuses of claim 4 in a predetermined arrangement.

11. The illuminating apparatus of claim 10, wherein the predetermined arrangement is a staggered arrangement.

12. The illuminating apparatus of claim 10, wherein the predetermined arrangement is a concentric arrangement of groups of light-emitting apparatuses which groups of light-emitting apparatuses are circularly or polygonally arranged, and numbers of light-emitting apparatuses of the respective groups become larger gradually from a center to an outer edge of the illuminating apparatus.

* * * * *